United States Patent
Celia, Jr. et al.

(10) Patent No.: US 12,237,202 B2
(45) Date of Patent: Feb. 25, 2025

(54) DIE BONDING SYSTEM WITH HEATED AUTOMATIC COLLET CHANGER

(71) Applicant: MRSI Systems LLC, Tewksbury, MA (US)

(72) Inventors: Nicholas Samuel Celia, Jr., Avon, MA (US); Cyriac Devasia, Nashua, NH (US)

(73) Assignee: MRSI Systems, LLC, Tewksbury, MA (US)

( * ) Notice: Subject to any disclaimer, the term of this patent is extended or adjusted under 35 U.S.C. 154(b) by 824 days.

(21) Appl. No.: 17/421,270

(22) PCT Filed: Mar. 18, 2020

(86) PCT No.: PCT/US2020/023252
§ 371 (c)(1),
(2) Date: Jul. 7, 2021

(87) PCT Pub. No.: WO2020/190991
PCT Pub. Date: Sep. 24, 2020

(65) Prior Publication Data
US 2022/0102187 A1     Mar. 31, 2022

Related U.S. Application Data

(60) Provisional application No. 62/819,996, filed on Mar. 18, 2019.

(51) Int. Cl.
*H01L 21/687* (2006.01)
*H01L 21/67* (2006.01)

(52) U.S. Cl.
CPC .. *H01L 21/68721* (2013.01); *H01L 21/67132* (2013.01); *H01L 21/67144* (2013.01)

(58) Field of Classification Search
CPC .......... H01L 2224/75313; H01L 24/75; H01L 21/67144; H01L 21/68721; H01L 21/67132
See application file for complete search history.

(56) References Cited

U.S. PATENT DOCUMENTS

| | | | |
|---|---|---|---|
| 6,010,056 A * | 1/2000 | Swanson | B23K 20/023 228/4.1 |
| 9,373,530 B2 * | 6/2016 | Schmidt-Lange | H01L 21/68 |
| 10,861,819 B1 * | 12/2020 | Deng | H05K 13/0813 |

(Continued)

FOREIGN PATENT DOCUMENTS

| | | | | |
|---|---|---|---|---|
| JP | 59028351 A | * | 2/1984 | ............. H01L 24/75 |
| JP | 2004047692 A | * | 2/2004 | |

(Continued)

OTHER PUBLICATIONS

International Preliminary Report on Patentability for PCT Appl. No. PCT/US2020/023252 dated Sep. 30, 2021, 9 Pages.

*Primary Examiner* — Erin B Saad
*Assistant Examiner* — Carlos J Gamino
(74) *Attorney, Agent, or Firm* — Maine Cernota & Curran

(57) ABSTRACT

A die bonding system comprising a heated bond head with the ability to heat up and cool down quickly, change tips to handle different sized dies, and load and unload tips automatically while maintaining the precision required to handle dies smaller than 200 um².

16 Claims, 17 Drawing Sheets

(56) References Cited

U.S. PATENT DOCUMENTS

| | | | |
|---|---|---|---|
| 2007/0181644 A1* | 8/2007 | Ueno | H01L 24/75 |
| | | | 257/E21.511 |
| 2008/0233680 A1* | 9/2008 | Okamoto | H01L 21/6838 |
| | | | 414/217 |
| 2008/0295970 A1 | 12/2008 | Afzali-Ardakani et al. | |
| 2009/0126188 A1* | 5/2009 | Sakai | H05K 13/046 |
| | | | 29/832 |
| 2010/0083494 A1* | 4/2010 | Lee | B23K 37/047 |
| | | | 29/832 |
| 2012/0267423 A1* | 10/2012 | Huang | H01L 21/6838 |
| | | | 294/183 |
| 2014/0154037 A1 | 6/2014 | Sen | |
| 2015/0129135 A1 | 5/2015 | Lee et al. | |
| 2015/0173209 A1* | 6/2015 | Dhavaleswarapu | B23K 20/023 |
| | | | 228/46 |
| 2017/0154804 A1 | 6/2017 | Angelov et al. | |
| 2018/0114767 A1* | 4/2018 | Wasserman | H01L 24/80 |
| 2022/0336281 A1* | 10/2022 | Tazawa | H01L 25/50 |
| 2023/0031977 A1* | 2/2023 | Yoshimoto | H01L 24/75 |
| 2023/0317676 A1* | 10/2023 | Baker | H01L 24/81 |
| | | | 228/193 |

FOREIGN PATENT DOCUMENTS

| | | |
|---|---|---|
| JP | 2016157885 A | 9/2016 |
| KR | 20080042583 A | 5/2008 |

* cited by examiner

DIE BONDING SYSTEM WITH HEATED AUTOMATIC COLLET CHANGER

RELATED APPLICATIONS

This application is a national phase application filed under 35 USC § 371 of PCT Application No. PCT/US2020/023252 with an International filing date of Mar. 18, 2020, which claims the benefit of U.S. Provisional Application No. 62/819,996, filed Mar. 18, 2019. Each of these applications is herein incorporated in its entirety by reference for all purposes.

FIELD OF THE DISCLOSURE

The disclosure relates to die bonding systems, and more particularly, to a die bonding system having heated, automatic collet changers, wafer heaters, alignment cameras, and cammed wafer handlers.

BACKGROUND OF THE DISCLOSURE

Typical die bonding applications involve placing dies on substrate. This may be done with the substrate at ambient temperature (e.g. where an epoxy is used) or at an elevated temperature, with heated substrates typically being heated from below to reflow temperatures while the bond head holds the die on top of the substrate (e.g. where pre-deposited solder is used or where the die is laid on top of a solder pre-form).

When reflowing multiple dies on the same substrate, it is desirable to have the bond head heat the die, as opposed to the substrate, to reflow temperatures, so as to not impact any previously-attached neighboring die(s).

In other cases, such as when heating the substrate from below using focused energy sources (e.g. a laser), it is desirable to have the die heated to minimize the laser energy needed to reflow, thereby reducing thermal shock to the die and substrate. Furthermore, focused energy sources, if relied upon to provide too much heat, can cause cracking of the substrate, thereby ruining it.

Heated bond heads to date have been typically designed for dedicated applications i.e. the bond heads are specific to a die size and designed to hold a steady temperature. The heated bond heads typically do not have the capability to ramp their temperature up or down quickly or to accommodate different die sizes.

Furthermore, heated bond heads, when picking dies from commonly used input devices (e.g. waffle-packs, gel-packs, and wafers) need to be cooled down to ~50° C., since the input devices are plastic trays or films and cannot handle higher temperatures.

Additionally, current state of the art die bond systems utilize various techniques to ensure the planarity of dies to a wafer to which they will be bonded prior to beginning the bonding operation, however, such techniques are often relatively slow, put the die and/or substrate at risk of damage, or must be done prior to each die bonding operation on a single wafer. For instance, 3d surface mapping using lasers to ensure the die is planar to the wafer, while accurate, must be done prior to each bonding operation. A gimballing head, which self-planarizes the die to the wafer, ensuring alignment, despite being reasonably fast and effective, can cause scrubbing of the substrate during alignment, resulting in a lower yield.

Even still further, for high precision die bonding systems to quantify and, ultimately, reduce final placement error, an error budget is typically created. This error budget is generally broken into various categories, such as motion error in the gantry, imaging error, system calibration error, error introduced during picking of the die, and error introduced while placing a die on the substrate. These errors can be minimized using well-established methods, such as a high-performance gantry system, high-quality imaging optics and illumination, and keeping the system in a temperature-stable environment to maintain system calibration. However, even using state of the art equipment and techniques, when pick and place systems pick up small devices, which are generally presented in trays or picked directly from a diced wafer, a 'pick' error is inevitably introduced.

One way to minimize pick error is to use a stationary up-facing camera that is located in the gantry work area, but mounted on the machine deck at a specific location. The stationary camera images die fiducials, which are positioned on the bottom of the die, and calculates the 'pick' error. The pick error is then accounted for by the gantry system when the die is placed on its final location. While this is generally effective, it is not without its challenges and limitations.

The location of the stationary up-facing camera mounted on the machine deck has to be calibrated precisely for high precision bonding. However, any changes in the ambient temperature or that of the gantry, which is typically due to heat generated by its motors, affects the calibration of the up-facing camera and is sometimes referred to as drift.

One way to account for the up-facing camera 'drift' due to thermals is to force a calibration step every 'x' seconds or minutes. This, however, is time-consuming and adds to the machine cycle time.

There is thus a need for a die bonding system having a heated bond head with the ability to heat up and cool down quickly, change 'tips' to handle different sized dies, load and unload tips automatically while maintaining the precision required to handle dies smaller than 200 um$^2$, and that minimizes pick error and the possibility of wafer cracking while quickly and effectively ensuring the planarity of die(s) to a wafer, preferably one that only requires one planarization procedure per wafer.

SUMMARY OF THE DISCLOSURE

Disclosed herein is a die bonding system comprising a heated bond head with the ability to heat up and cool down quickly, change tips, which may herein be referred to as end effectors, to handle different sized dies, and load and unload tips automatically while maintaining the precision required for handling dies smaller than ~200 um$^2$.

The die bonding system, in embodiments, further comprises a wafer handler that rests on cams, which allow the rapid planarization thereof to a die bond head and do not require re-planarization between subsequent die bonding operations using the same wafer.

The die bonding system, in further embodiments, also comprises a substrate heater that functions to heat the wafer from below using a contact heater that substantially encircles an area in which a die is to be bonded, allowing it to be pre-heated before a focused energy source, such as a laser, is aimed therethrough to supply the additional heat necessary to carry out the die bonding operation, thereby minimizing the chance of wafer cracking and misalignment.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
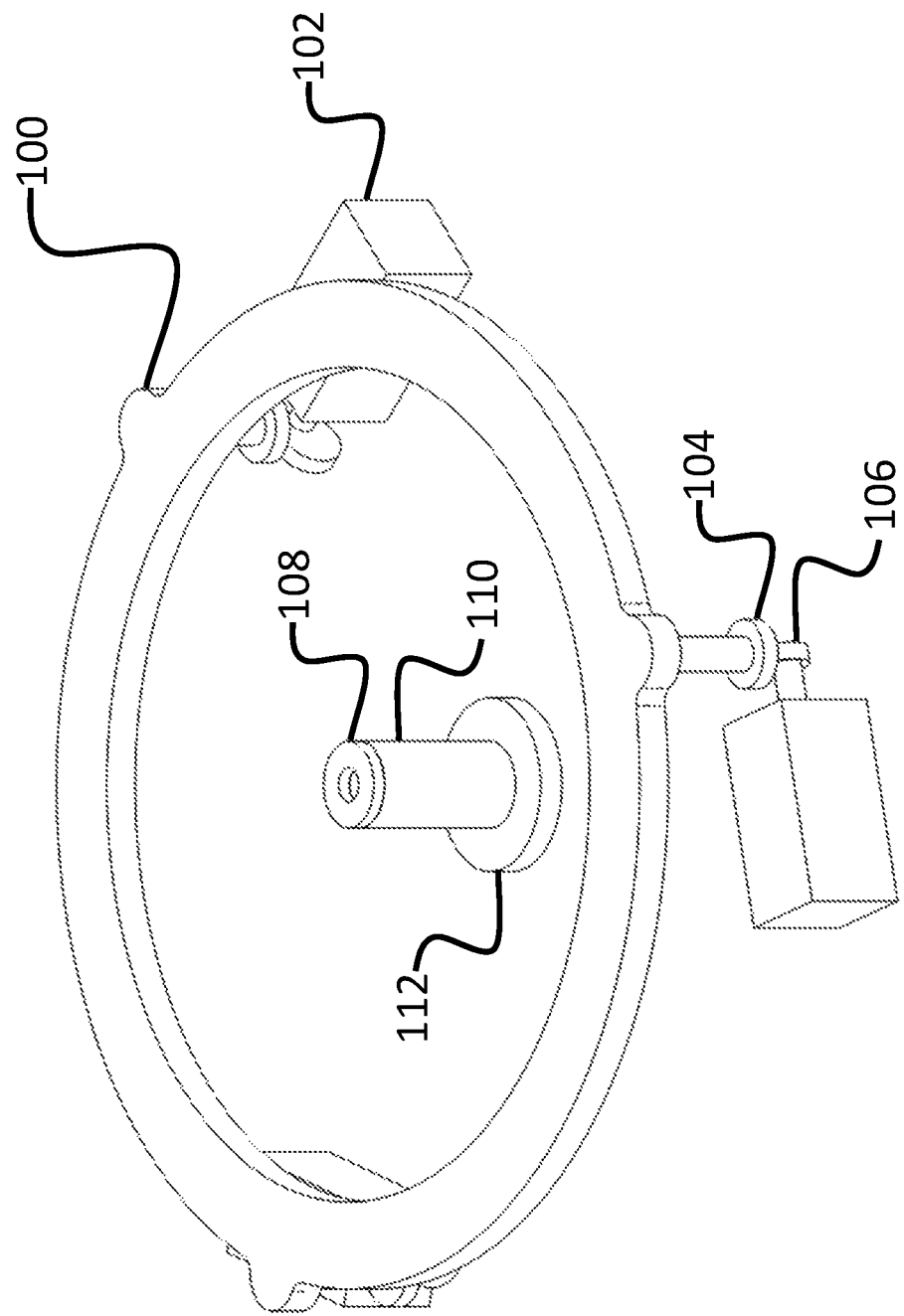
FIG. 1 is an isometric view of a cam-adjustable wafer table and wafer pre-heater, in accordance with embodiments of the present disclosure.

For the purposes of this disclosure, the X, Y, and Z axis should be understood to refer to the three orthogonal linear axes while "T", which may also be referred to as Theta or $\Theta$, refers to a revolute axis.

Furthermore, as herein used, the term "cammed", when used in reference to a wafer handler 100, should be understood to refer to a wafer handler 100 that is able to manipulate the roll, pitch, and yaw of a wafer 300 to achieve planarization. In non-cammed wafer handler 100 embodiments, Z-axis motion of the wafer handler 100 is still present. In even other embodiments, the wafer handler 100 may be cammed, but restricted to Z-axis motion, in embodiments by synchronizing all cams 106.

FIGS. 1-9 show a cam-adjustable, or cammed, wafer handler 100 that maximizes efficiency, while ensuring planarity of a wafer 300 to a die bond head 1200, by requiring only one alignment procedure to be performed per-wafer 300, assuming that a single tip 1100, which may also be herein referred to as an end effector 1100, is used to bond dies thereto (in embodiments, an alignment procedure must be performed after a tip 100 change as well).

The cammed wafer handler 100, in embodiments, utilizes three motors 102, with each motor 102 distributed evenly around the wafer handler 100 and having a cam 106 affixed thereto, the cams 106 each resting on a separate pedestal 104 that is connected to the wafer handler 100, providing for fine alignment of a die bond head 1200 to a wafer 300. More specifically, such embodiments allow for precise control over the roll, pitch, and yaw of a wafer 300 mounted on the wafer handler 100, allowing the planarity of the wafer 300 to be precisely matched with a die-to-be-bonded.

In embodiments, a die-to-be-bonded is suspended above the wafer by a die bond head 1200 to which a heater 1000 and removable tip 1100 are affixed. In embodiments, the die bond head 1200 is itself disposed on an overhead gantry to allow for gross positioning thereof.

In embodiments, three distance sensors are used to planarize a wafer 300 to the die bond head 1200, one of which is used to profile the wafer 300. In embodiments, a flat vacuum platen is used to secure a wafer 300 to the cammed wafer handler 100.

In embodiments, the motors 102 are stepper motors.

Figure 2:
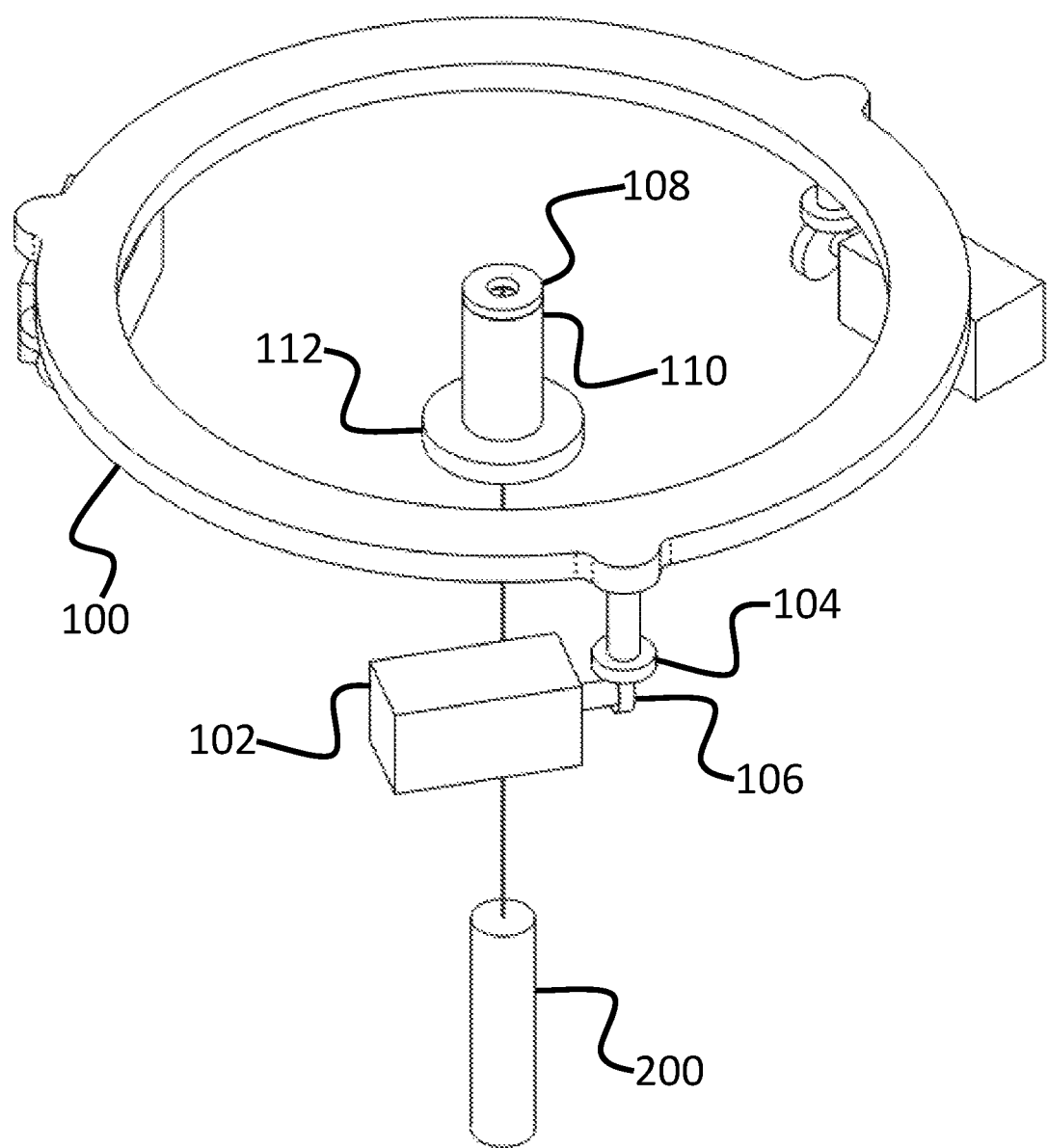
FIG. 2 is an isometric view of a cam-adjustable wafer table, wafer pre-heater, and focused energy source, in accordance with embodiments of the present disclosure.
Figure 3:
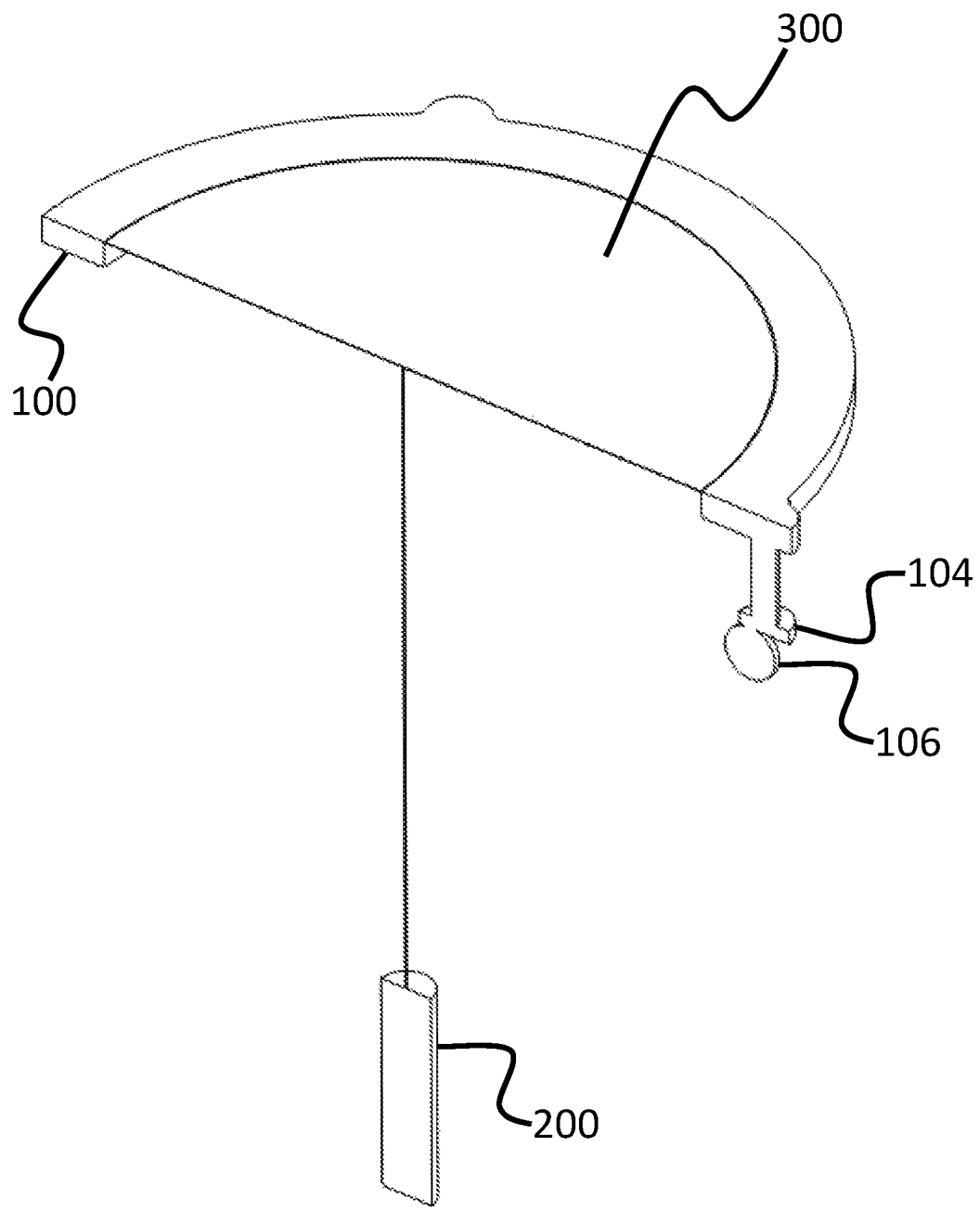
FIG. 3 is a section view of a cam-adjustable wafer table and focused energy source, in accordance with embodiments of the present disclosure.
Figure 4:
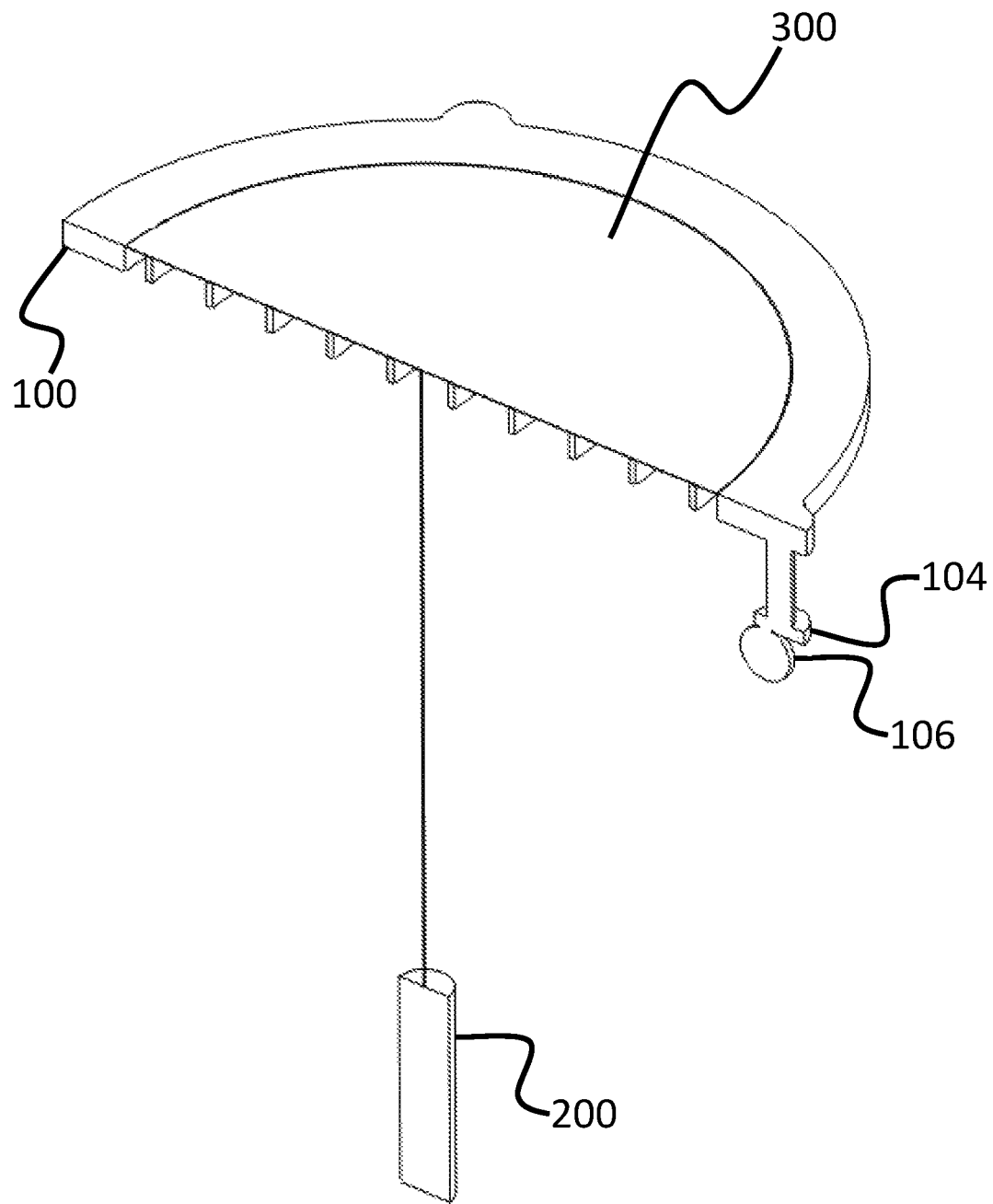
FIG. 4 is a section view of a cam-adjustable wafer table having a wafer support structure and focused energy source, in accordance with embodiments of the present disclosure.

Now referring to FIGS. 3-9, these Figures show the cammed wafer handler 100 of FIGS. 1-2 with a flat vacuum platen mounted thereon. The flat vacuum platen, in embodiments, comprises vacuum passages disposed about an upper surface thereof that are connected to a vacuum source disposed on a die bond system of which the wafer handler 100 is a part, allowing a wafer 300 to be held tightly and flatly against the wafer handler 100, enabling a high degree of die bonding accuracy.

Figure 5:
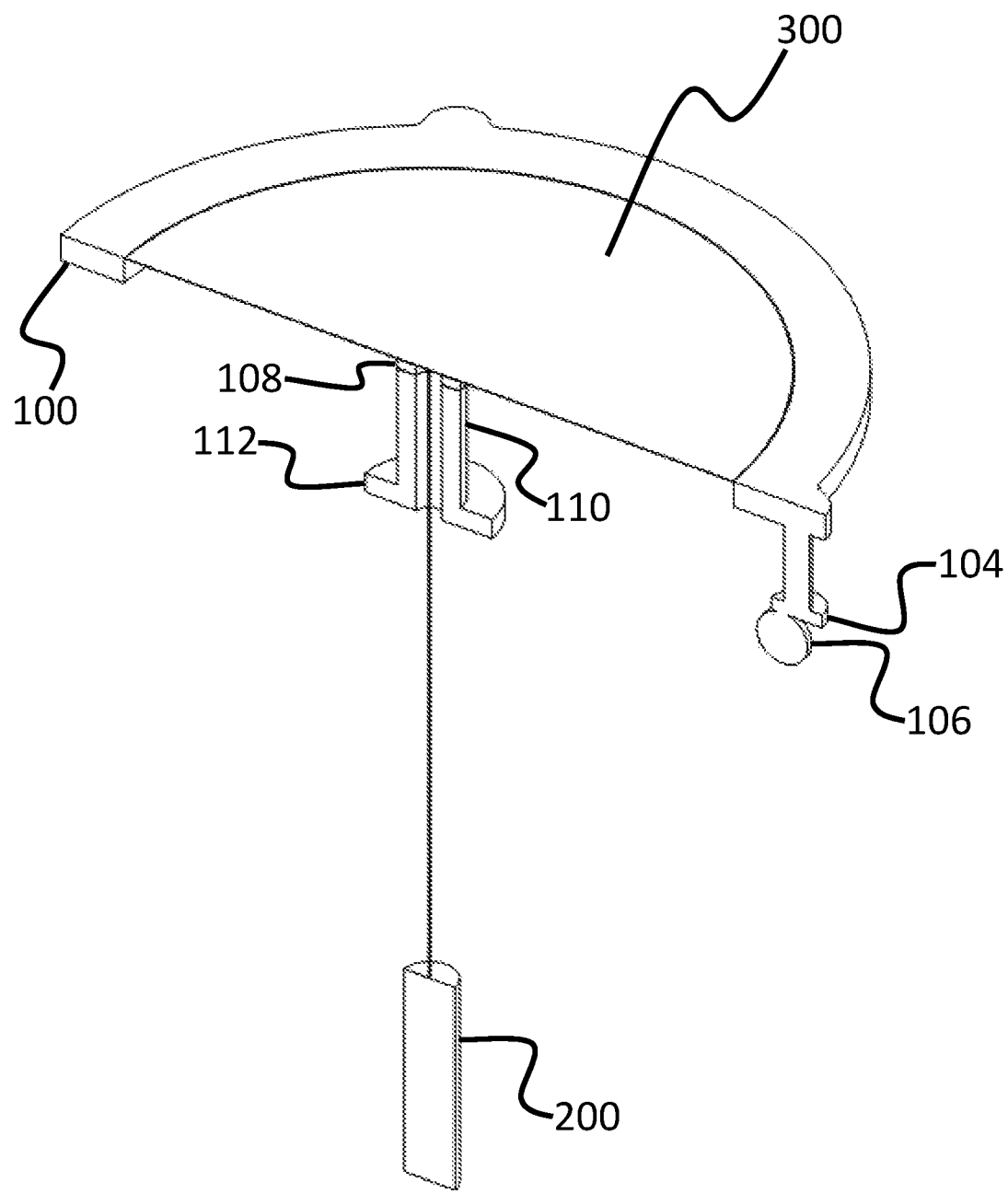
FIG. 5 is a section view of a cam-adjustable wafer table, wafer pre-heater, and focused energy source, in accordance with embodiments of the present disclosure.
Figure 6:
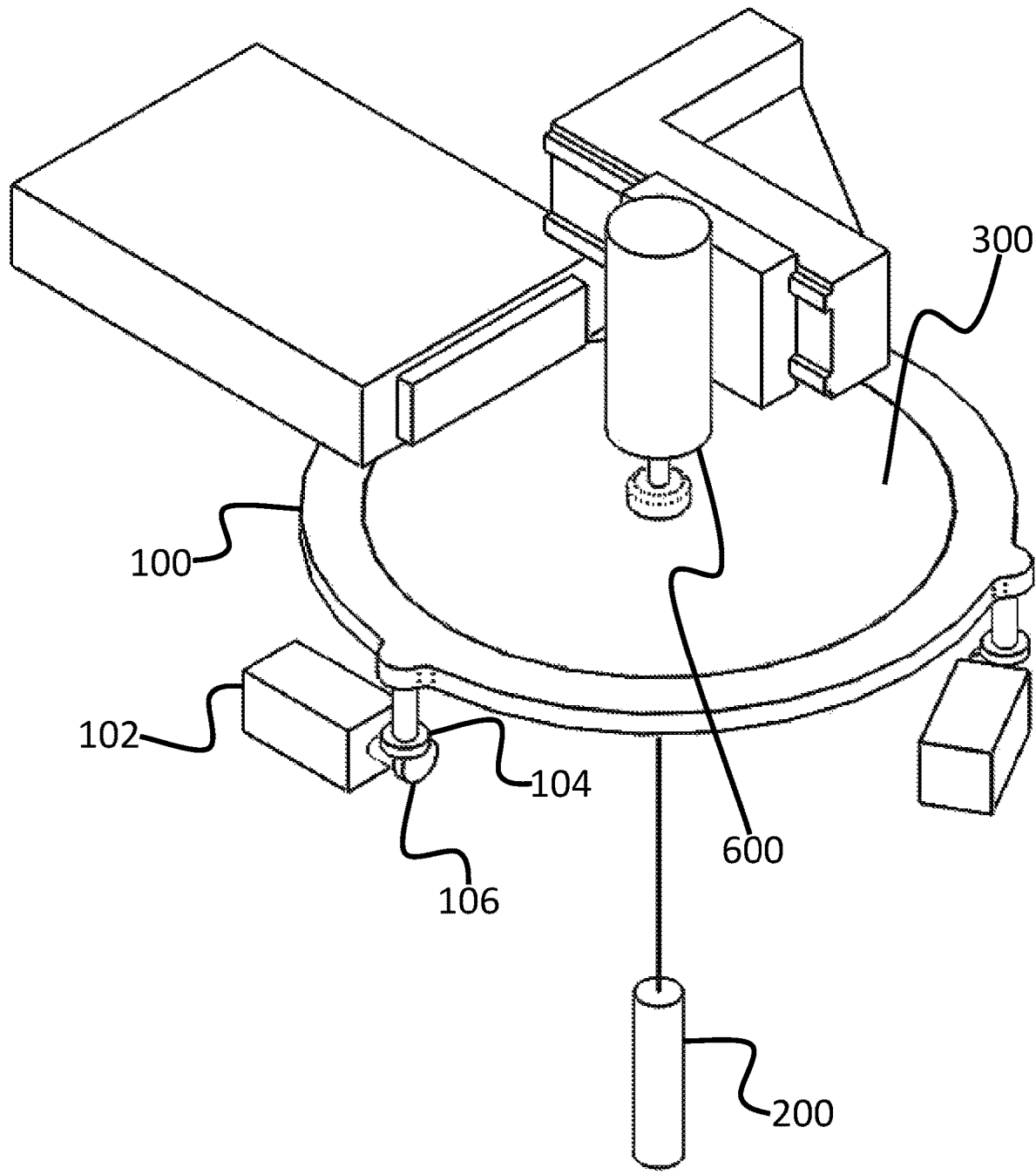
FIG. 6 is an isometric view of a cam-adjustable wafer table and focused energy source that further includes a near-field camera in a retracted position, in accordance with embodiments of the present disclosure.
Figure 7:
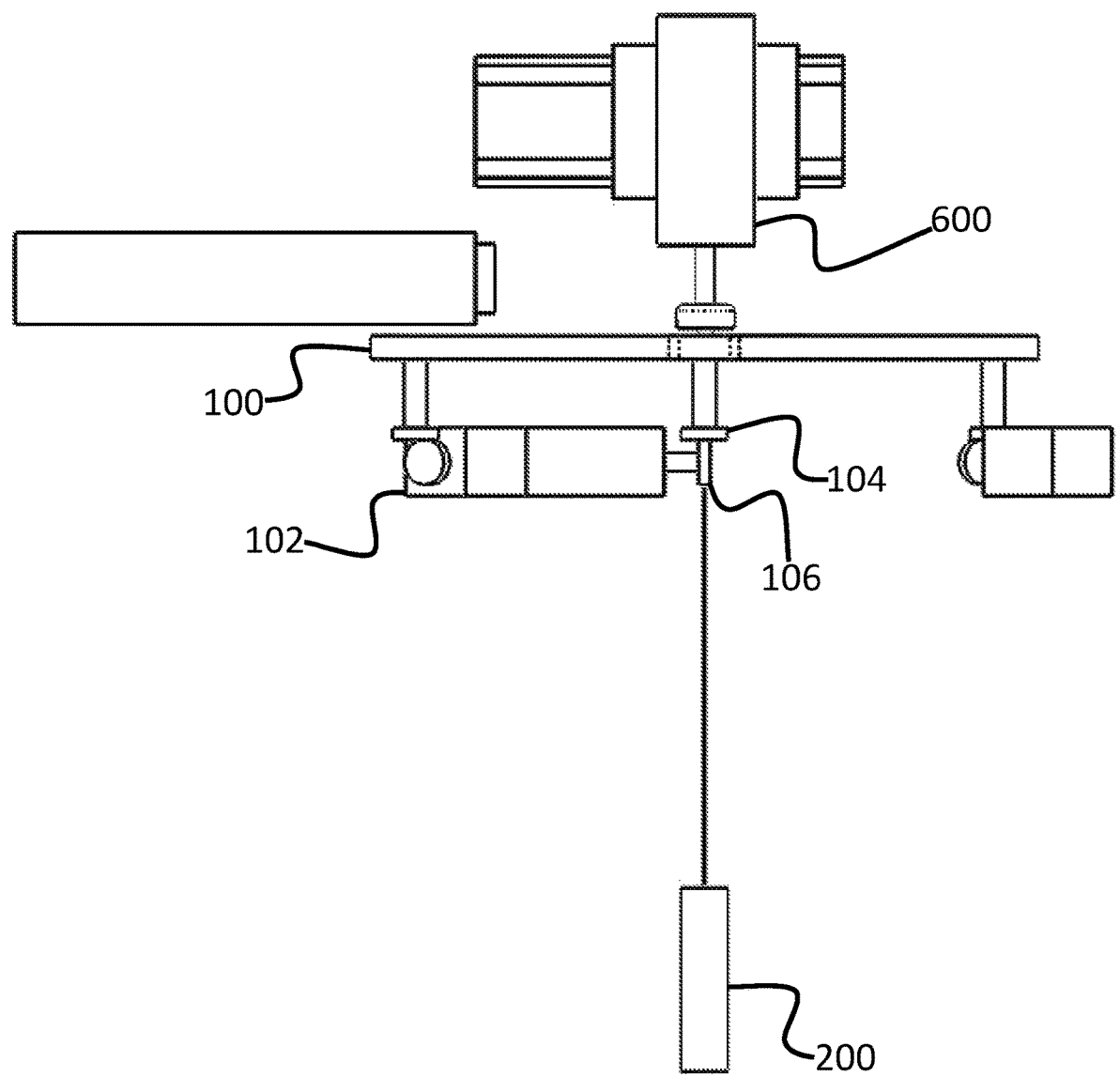
FIG. 7 is a side elevation view of a cam-adjustable wafer table and focused energy source that further includes a near-field camera in a retracted position, in accordance with embodiments of the present disclosure.
Figure 8:
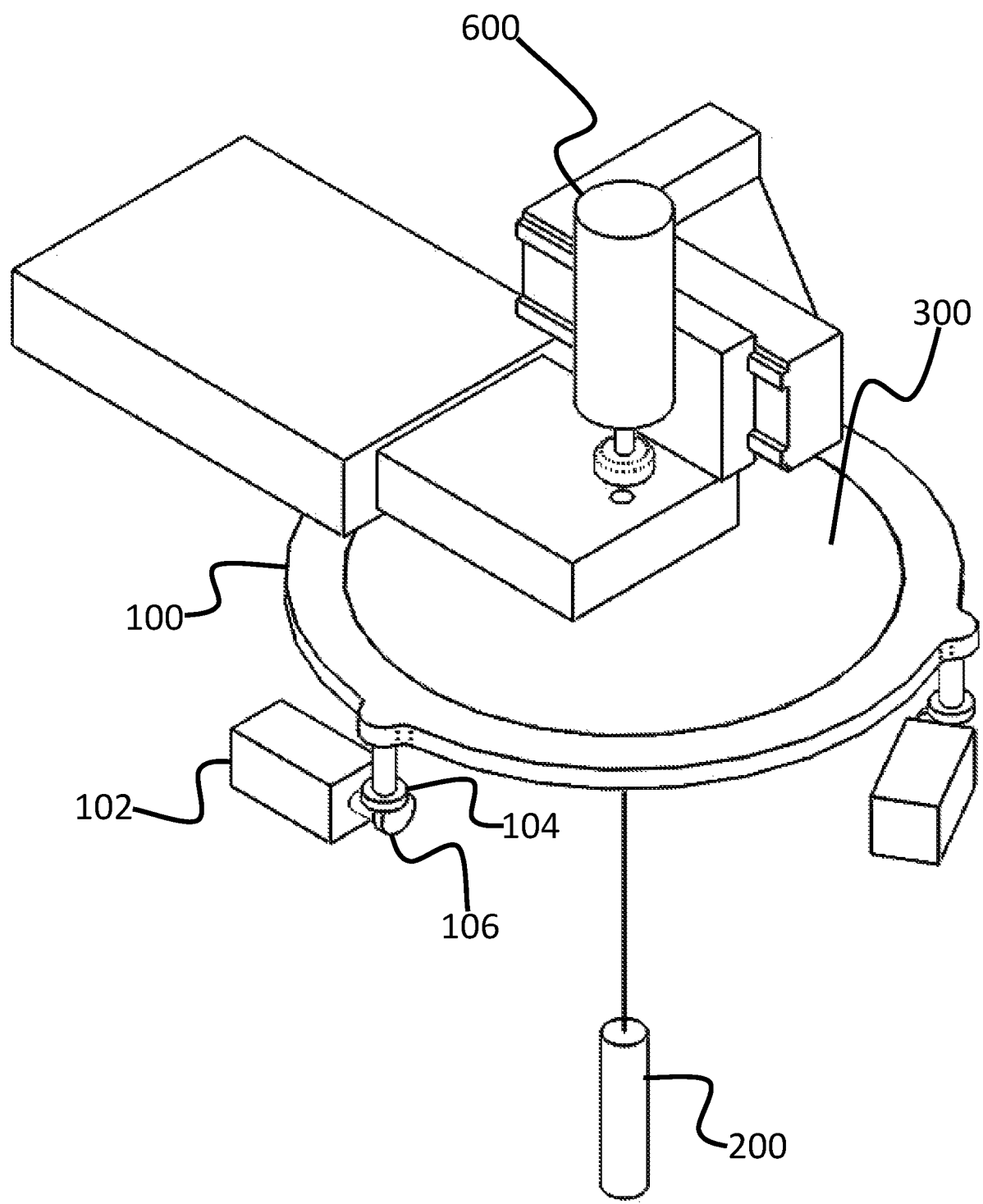
FIG. 8 is an isometric view of a cam-adjustable wafer table and focused energy source that further includes a near-field camera in an extended position, in accordance with embodiments of the present disclosure.
Figure 9:
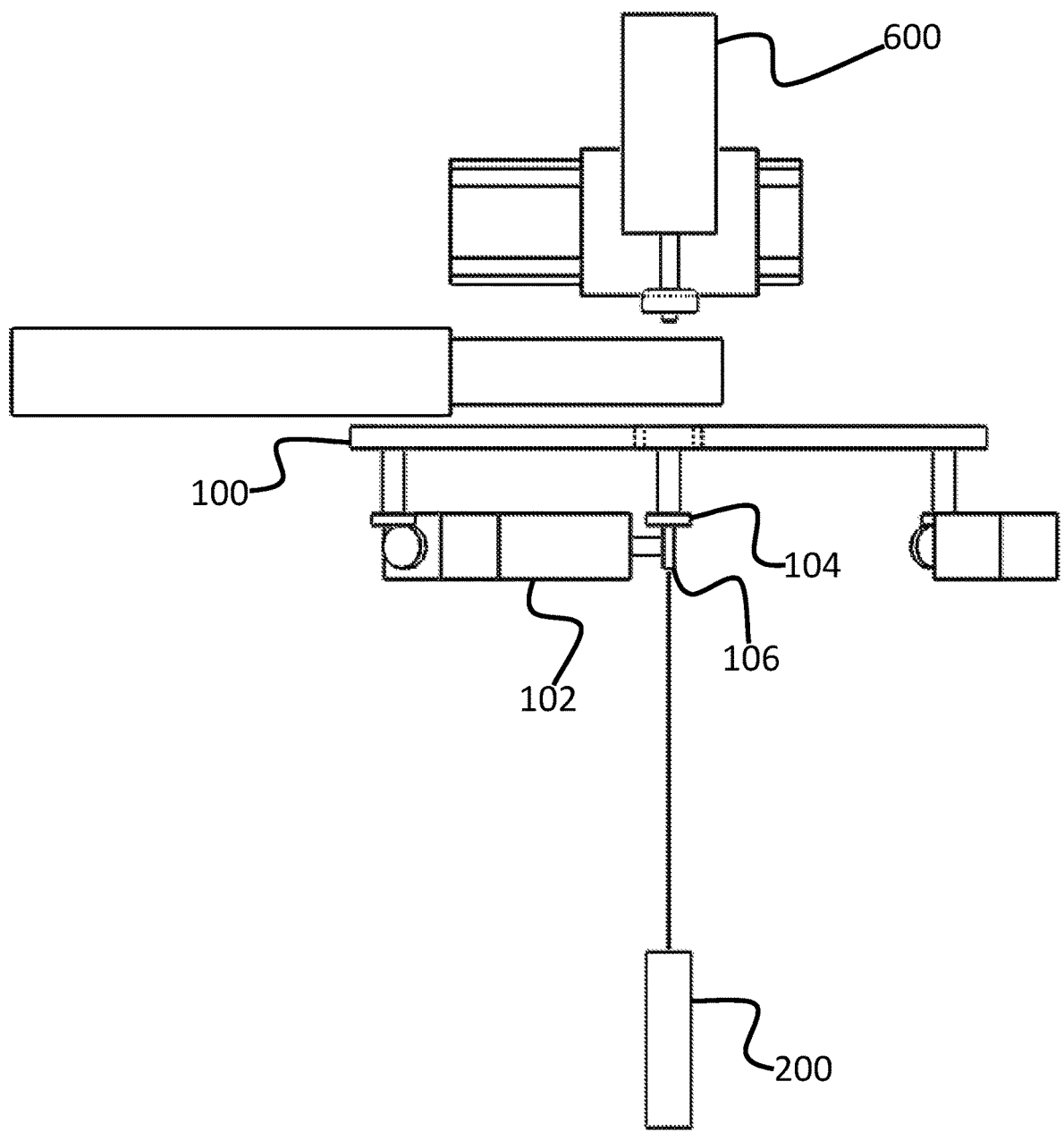
FIG. 9 is a side elevation view of a cam-adjustable wafer table and focused energy source that further includes a near-field camera in an extended position, in accordance with embodiments of the present disclosure.

In embodiments, the wafer handler 100 is used in one of three general ways. In a first embodiment, a cammed wafer handler 100 planarizes to the bottom of a die and/or tip 1100, which may be removable, via sensor feedback on one or both surfaces. In a second embodiment, a wafer pre-heater 108, such as that depicted in FIGS. 1, 2, and 5, is used to planarize local areas on the wafer. No wafer 300 camming is necessary in such embodiments, as the wafer pre-heater 108 of such embodiments is permanently planarized with respect to bottom of tips 1100, which may be removable, on a die bond head 1200. In a third embodiment, a gimballing tip 1100 is used with a non-cammed wafer handler 100 for die placement.

Now referring specifically to FIG. 1, an isometric view of a cam-adjustable wafer handler 100, which may also be herein referred to as a wafer table 100, and wafer pre-heater 108 are shown. The embodiment shown in FIG. 1 comprises three motors 102, each connected to a cam 106 comprising a cam lobe 106 configured to make sliding contact with a separate wafer table projection 104 while rotating, thereby imparting variable motion to the wafer table 100 via the wafer table projections 104. Through precise, independent control of these motors 102, the roll, pitch, and yaw of the wafer table 100 and any wafer 300 mounted thereto can be manipulated to achieve planarization. By synchronizing the rotation of these motors, Z-axis motion of the wafer table 100 can be accomplished.

FIG. 1 also shows a wafer pre-heater 108, in accordance with embodiments of the present disclosure. The wafer pre-heater 108 comprises a pedestal portion 110 and a base 112 that, in embodiments, is mounted to a movable platform to permit the alignment thereof to a particular region of the wafer table 100 and a wafer 300 mounted thereon. In such embodiments, the wafer pre-heater 108 may be used to both heat and locally planarize a wafer 300.

In embodiments, the wafer pre-heater 108 is permanently planarized with respect to a tip 1100 configured to hold a die-to-be-bonded.

In embodiments, the wafer pre-heater 108 comprises a hollow central section configured to allow a focused energy source 200 to be transmitted therethrough.

In embodiments, the wafer pre-heater 108 alone is used for both heating and planarization.

In other embodiments, such a planarization system and method may be combined with a cammed wafer frame 100, which, in embodiments, through synchronized movement of cams 106, is only used as a Z-axis positioner to remove and attach a wafer 300 to the wafer pre-heater 108. In such embodiments, the cammed wafer handler 100 may be positioned just below a wafer-contacting portion of the wafer pre-heater 108, allowing the cammed wafer handler 100 to limit the sag of wafer 300 edges, thereby reducing stress on the wafer 300 during a bonding operation.

In other embodiments, the wafer 300 itself is movable, while the wafer pre-heater 108 remains stationary. In still other embodiments, the wafer 300 is capable of gross movement in the X and Y directions and limited movement in the Z direction while the wafer pre-heater 108 is capable of movement in the Z direction only.

The wafer pre-heater, in embodiments, includes a heater 108, in embodiments a circular heater 108, disposed at a tip thereof, i.e. the end furthest from the mounting base 112 that is separated therefrom by a pedestal 110. The heater 108 is, in embodiments, thermally isolated from the remainder thereof and die bonding system generally by a thermal insulator, in embodiments, a ceramic disk. The wafer pre-heater 108, in embodiments, further comprises a hollow central section that is in communication with a focused energy source 200, such as a laser 200, that is of sufficient power to complete a die bonding operation.

In embodiments, the heater 108 located at the tip of the wafer pre-heater 108 functions to preheat a portion of a wafer 300 to a temperature sufficient to minimize the energy required from the focused energy source 200 to complete a die bonding operation, thereby reducing the chances of wafer 300 cracking, thereby improving yield while ensuring a strong bond.

FIGS. 10-14 show an additional design for a heater, a die heater 1000, in accordance with embodiments of the present disclosure. The die heater 1000 shown in FIGS. 10-14 utilizes a plurality of rods 1004 or pins 1004 that are evenly and concentrically disposed about a central axis of the die heater 1000 and act as a standoff for the die heater 1004. In this design, the rods 1004 serve as a flexure mount, allowing for repeatable thermal expansion and contraction characteristics that enable sub-micron accuracy, since thermal expansion and contraction result in the central axis of the die heater 1000 precisely returning to its set point following each thermal cycle. Additionally, the use of rods 1004 helps to isolate the die heater 1000 from a remainder of a die bonding system, reducing parasitic heat loss thereto while minimizing thermal expansion and contraction thereof due to heat conduction to or from the die heater 1000.

In embodiments, the die heater 1000 is cooled by forced air cooling. In embodiments, a die bonding system to which the die heater is attached, during use, provides the forced air for cooling. In embodiments, the cooling air is directed against a backside of the die heater 1000 using a nozzle to focus the air thereon.

In embodiments, rods 1004 are retained in a die bonding system through the use of jaws, set screws, or other suitable retaining means, as would be known to one of ordinary skill in the art.

The heater embodiment shown in FIGS. 10-14 also comprises a trough 1008 comprising a vacuum port 1006 surrounding a circular central projection 1012 which itself, in embodiments, comprises a second, centrally-located vacuum port 1010. The trough 1008 is configured, in embodiments, to retain removable tips 1100, which can also be considered adapters 1100 that allow the die heater 1004 to pick and place a variety of dies and to accommodate a variety of mounting locations (e.g. deep wells that require a slim die-holding extension), through the use of a vacuum drawn through the vacuum port 1006. The second, centrally-located vacuum port 1010 of embodiments is used, in embodiments, to provide vacuum to a tip 1100 that, in embodiments, passes that vacuum through connector 1102, providing for secure retaining of a die or dies thereon.

In embodiments, the removable tips 1100 comprise a connector 1102 configured to allow for connection between the removal tip 1100 and a die to be bonded. In embodiments, the connector 1102 provides for the communication of electricity, vacuum, and/or information between the die heater 1000 and removable tip 1100 and/or die retained thereby. In embodiments, the connector 1102 provides for the selective communication of vacuum between the die heater 1000 and removable tip 1100, allowing a die or dies to be selectively retained thereby.

In embodiments, the removable tips 1100 comprise at least one alignment feature 1104 that, in embodiments, is used to obtain rough alignment of the tip 1100, in embodiments by interfacing with a dowel 1504 located in at least one pocket of the machine deck 1500.

In embodiments, the removable tips 1100 comprise at least two alignment apertures 1106 that, in embodiments, are used in conjunction with at least one near-field camera assembly 600 as fiducials to obtain fine alignment. In embodiments, the removable tips 1100 comprise three such alignment apertures 1106.

In embodiments, the central projection 1012 is non-circular, allowing rotation of the removable tips 1100 to be constrained more than friction alone would allow.

In embodiments, the central projection 1012 is of the same height as the remainder of the die heater 1004, with the exception of the aforementioned trough 1008.

In embodiments, the tips 1100 are configured to gimbal, in embodiments using a gantry-mounted gimbal. Such embodiments are suitable for use with non-cammed wafer handlers 100. In other embodiments, a non-heated, gim-balling tip 1100 may also be used with non-cammed wafer handlers 100. In still other embodiments, non-gimballing, non-heated tips may be used with cammed wafer handlers 100, such as those depicted in FIGS. 1-9 and described in the following paragraphs. In even still other embodiments, non-gimballing, heated tips 1100 may be used with cammed wafer handlers 100.

Figure 10:
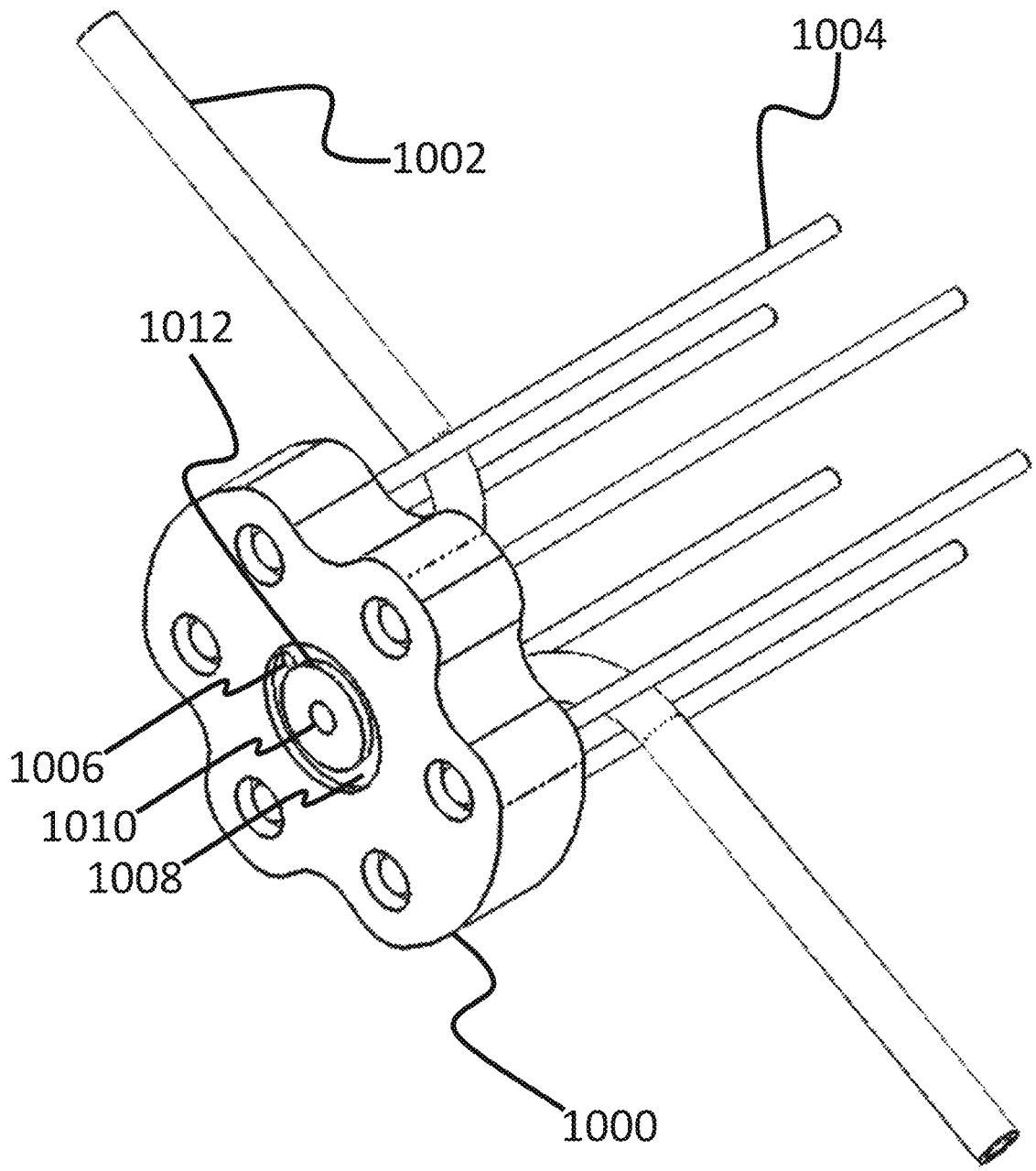
FIG. 10 is a perspective view showing a heated bond head with no tip or end effector, where the heater power leads and cooling port are identified, configured in accordance with embodiments of the present disclosure.
Figure 11:
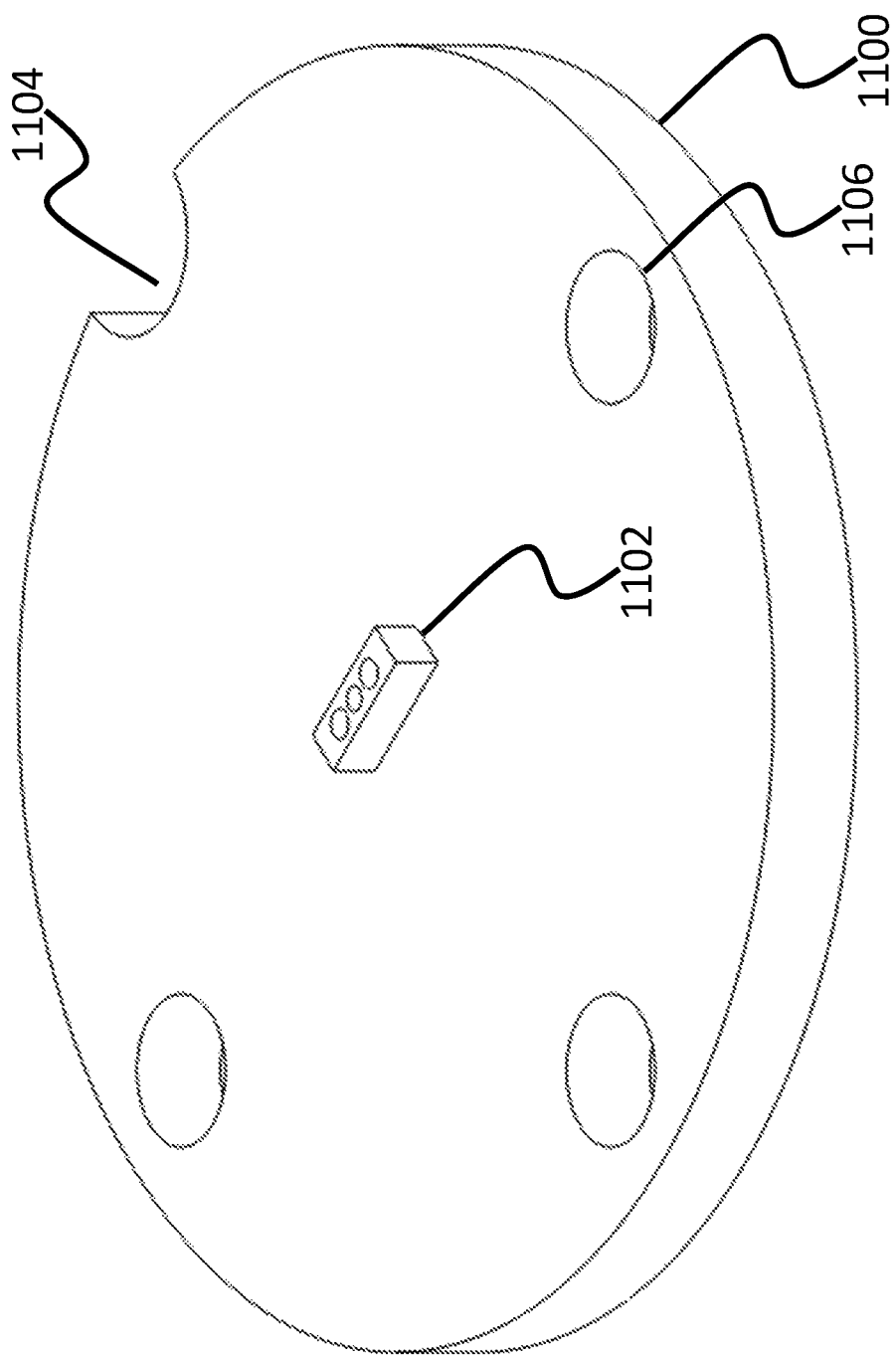
FIG. 11 is a perspective view showing a tip or end effector, configured in accordance with embodiments of the present disclosure.
Figure 12:
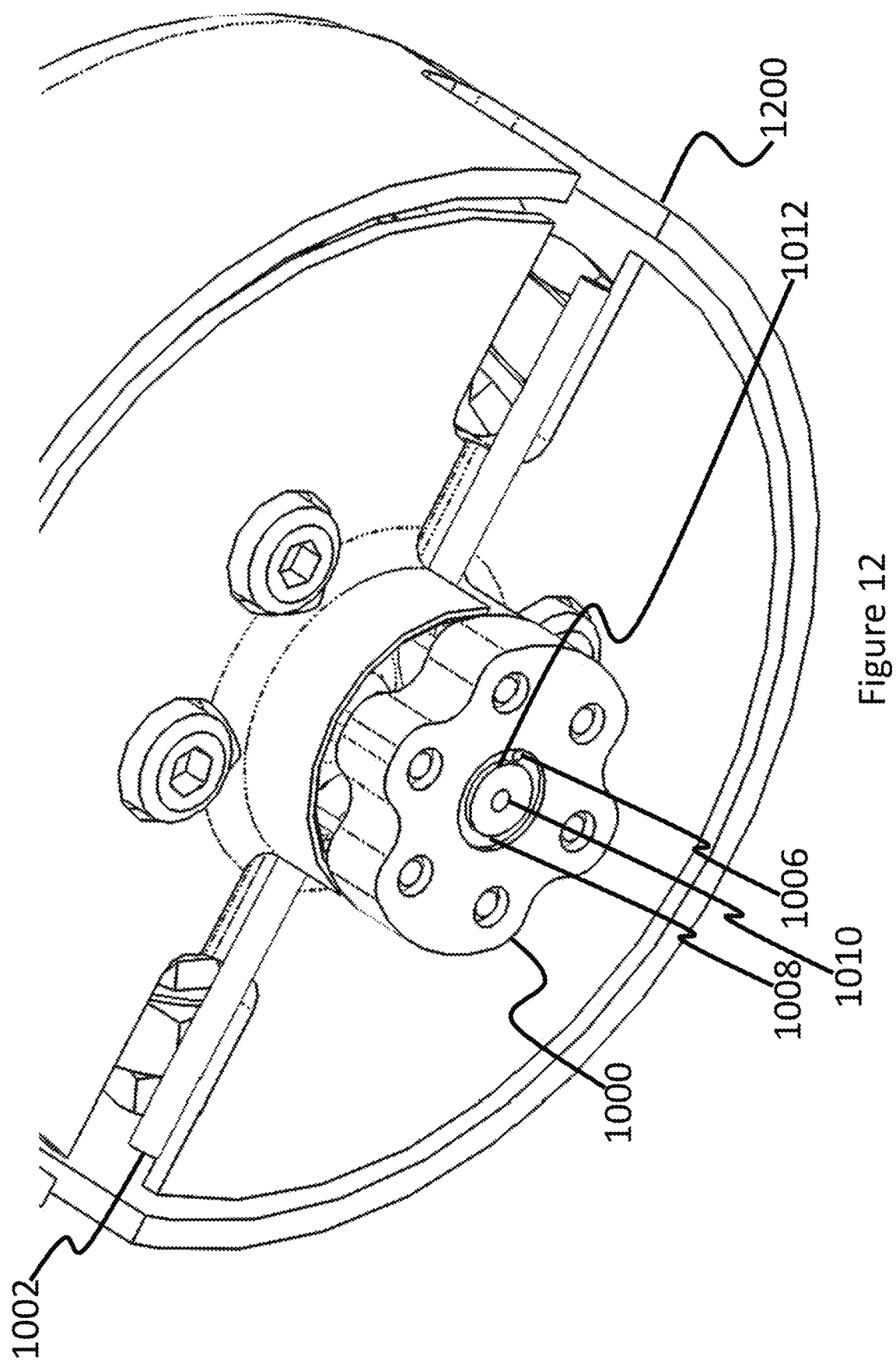
FIG. 12 is a perspective view of the heated bond head with no tip or end effector of FIG. 10 connected to a die bond head, in accordance with embodiments of the present disclosure.
Figure 13:
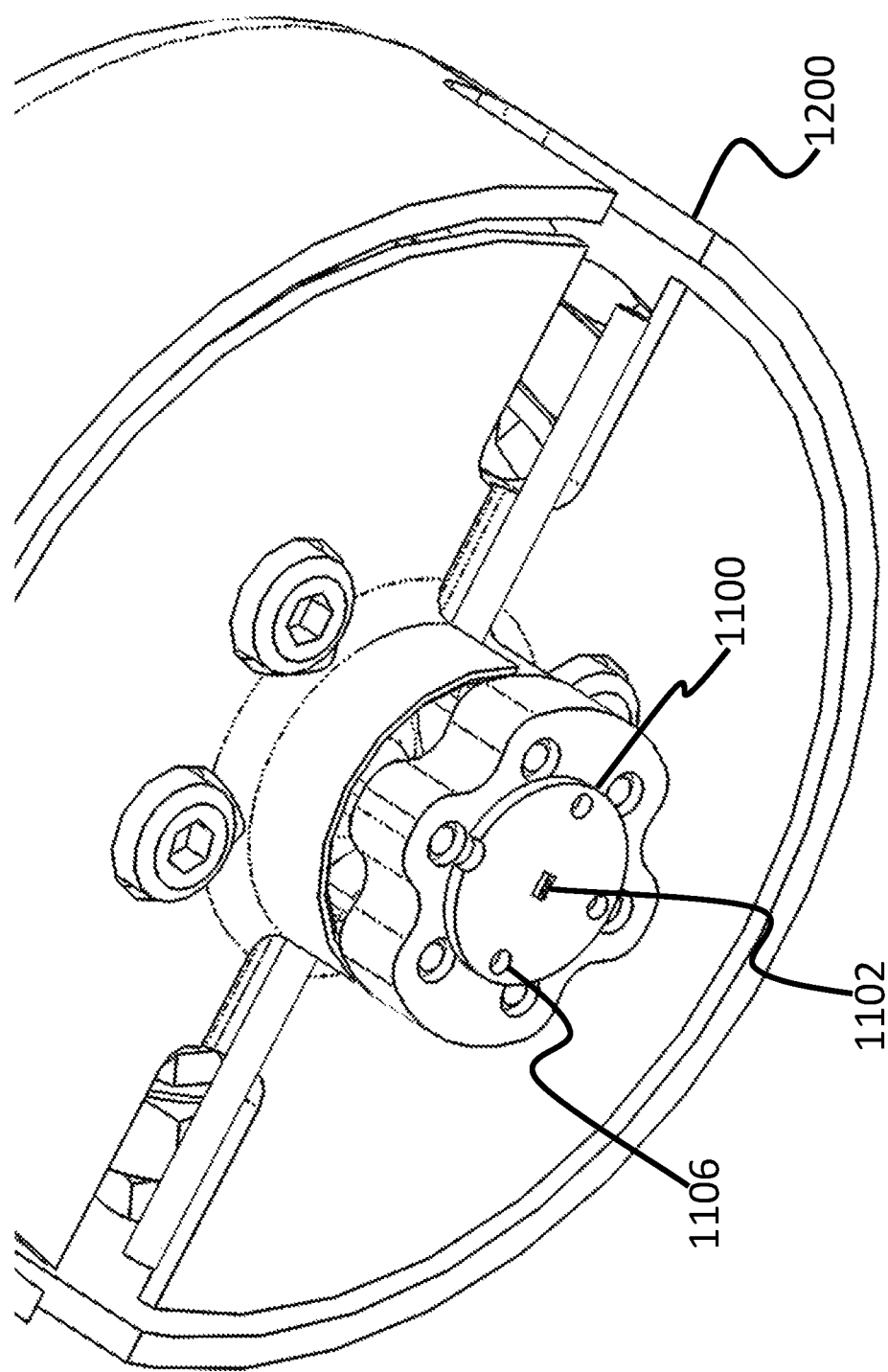
FIG. 13 is a perspective view of the heated bond head of FIG. 10 with the tip or end effector of FIG. 11 connected thereto and the entire assembly connected to a die bond head, in accordance with embodiments of the present disclosure.
Figure 14:
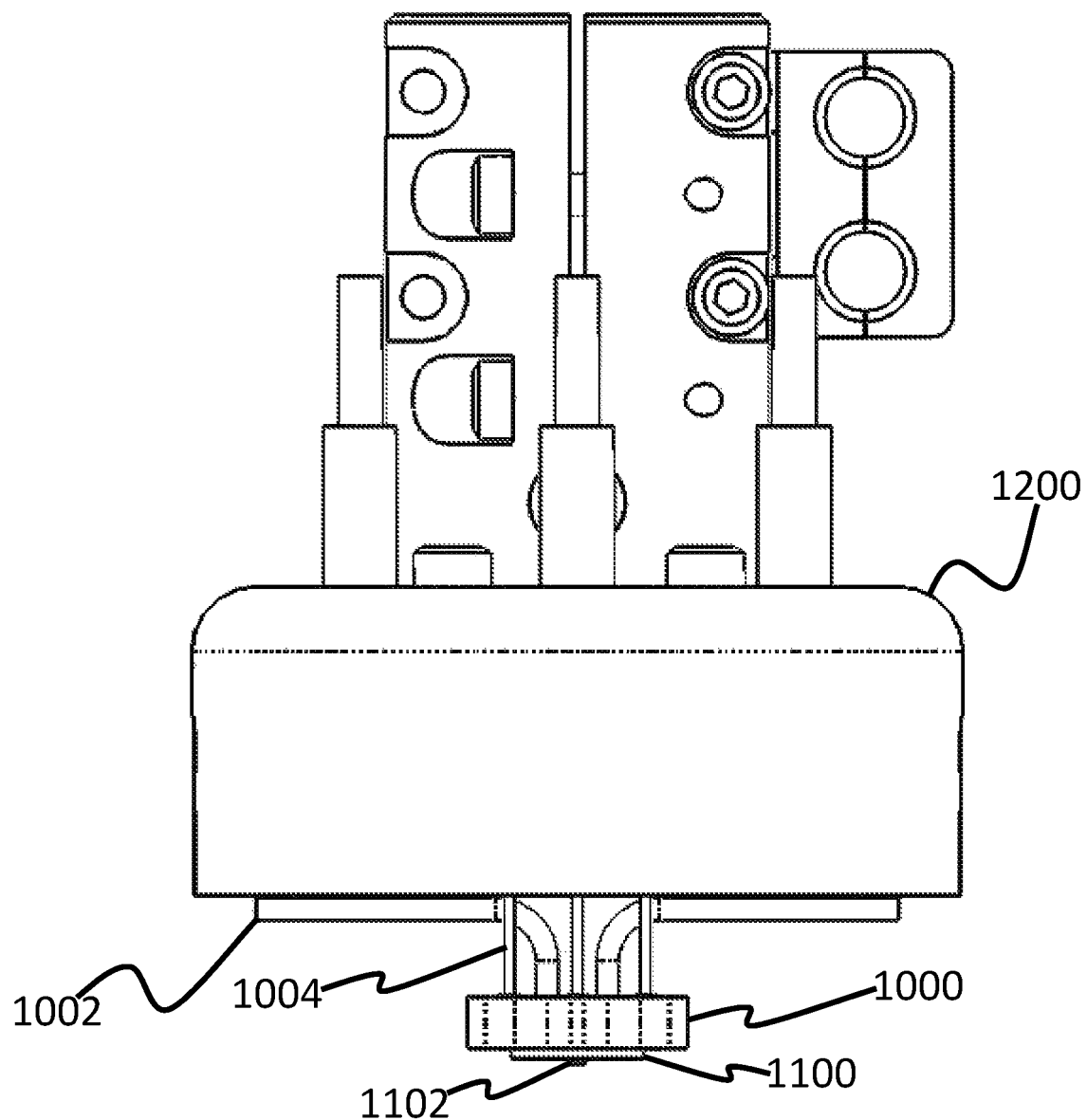
FIG. 14 is a side elevation view of the heated bond head of FIG. 10 with the tip or end effector of FIG. 11 connected thereto and the entire assembly connected to a die bond head, in accordance with embodiments of the present disclosure.

Alternative embodiments of the die heater 1000 shown in FIG. 10 are shown in FIGS. 12-14, where the die heater 1000 is attached to a a die bond head 1200 that is, in embodiments, connected to a gantry (not depicted in figures). The heater design shown in these figures allows for enhanced mechanical repeatability, which allows more accurate placement of dies, faster heating and cooling, due to the absence of mass from the die heater 1000 support and constraint surfaces, relatively simple planarity mirroring, and minimizes heat conduction to the larger system, due, in part, to the thermal isolating effects of the pin 1004 support system thereof.

Furthermore, the heater comprises at least two vacuum connections 1002. The first vacuum connection 1002 connects a vacuum source to an orifice 1006 disposed in the aforementioned trough 1008, which is configured to accept a removable tip configured to fit therein, allowing the removable tip 1100 to be selectively retained. This configuration allows the removable tip 1100 to be easily replaced to allow the bonding of a different die or to allow for bonding to occur in a location requiring a different removable tip 1100. The second vacuum connection 1002 connects a vacuum source, which may be the same or a different vacuum source, to a central orifice 1010 of the die heater 1000. In embodiments, removable tips 1100 configured for use with this die heater 1000 comprise an orifice 1102 adjacent a die-retaining area located opposite the die heater 1000 that connects to this central orifice 1010, allowing vacuum to be applied therethrough, thereby allowing for the selective retaining (i.e. pick and place functionality) of a die to be bonded.

In embodiments, the aforementioned rods 1004 are electrical studs 1004 or pins 1004 that serve a dual purpose, namely fixing the die heater 1000 to the remainder of a die-bonding system and supplying power and ground to the die heater 1004. In other embodiments, the aforementioned rods 1004 may serve only to fix the die heater 1000 to the remainder of a die-bonding system. In embodiments, six rods 1004 are used, although greater or fewer rods 1004 could be used without departing from the teachings of the present disclosure.

Figure 15:
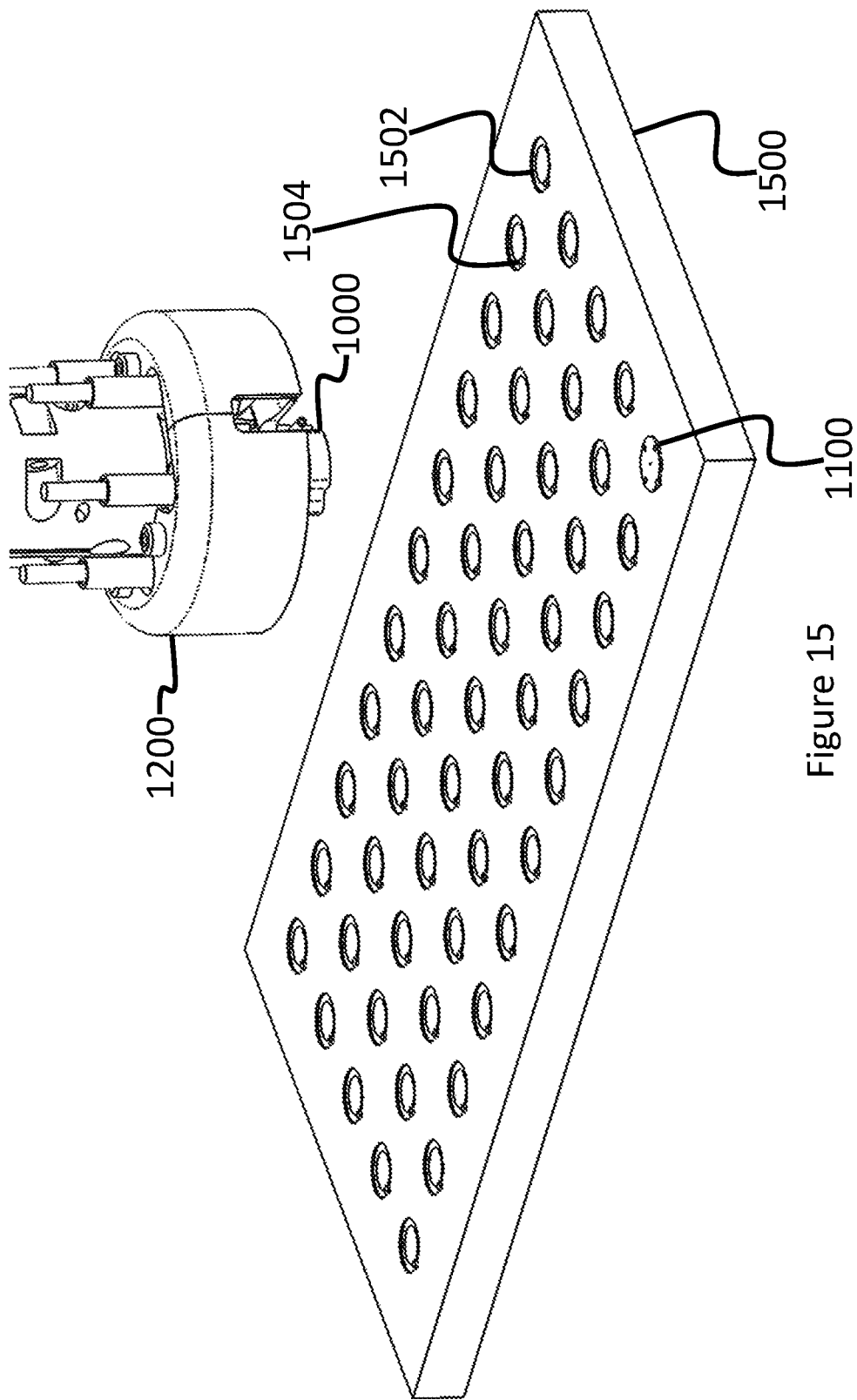
FIG. 15 is a perspective view showing a die bond head positioned above a machine deck having a plurality of pockets configured to retain tips or end effectors in a nominal XYZT location, one pocket containing a tip or end effector, configured in accordance with embodiments of the present disclosure.
Figure 16:
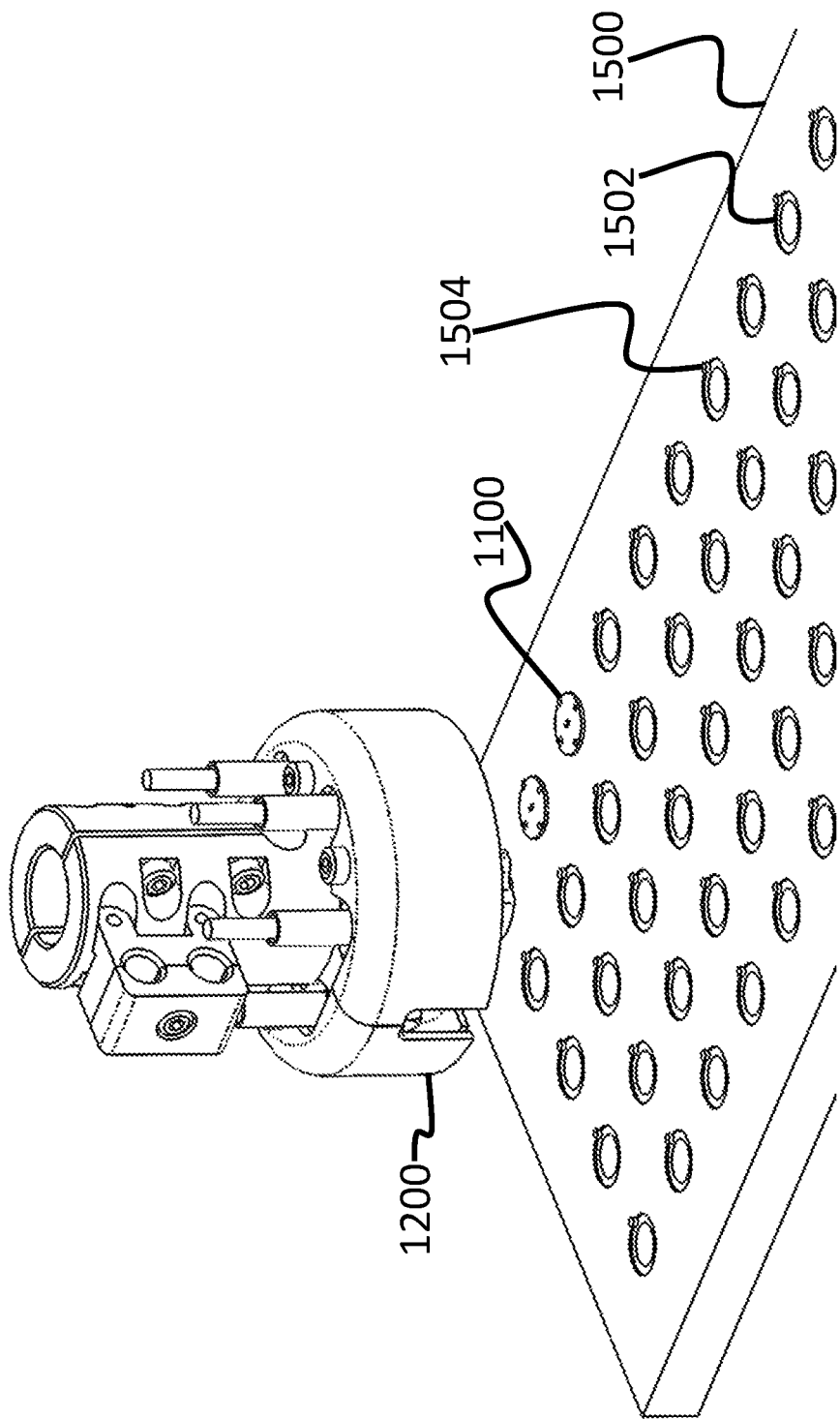
FIG. 16 is a perspective view showing a die bond head positioned just above a machine deck having a plurality of pockets configured to retain tips or end effectors in a nominal XYZT location, some pocket containing a tip or end effector, the die bond head depicted picking up a tip or end effector from a pocket of the machine deck, in accordance with embodiments of the present disclosure.
Figure 17:
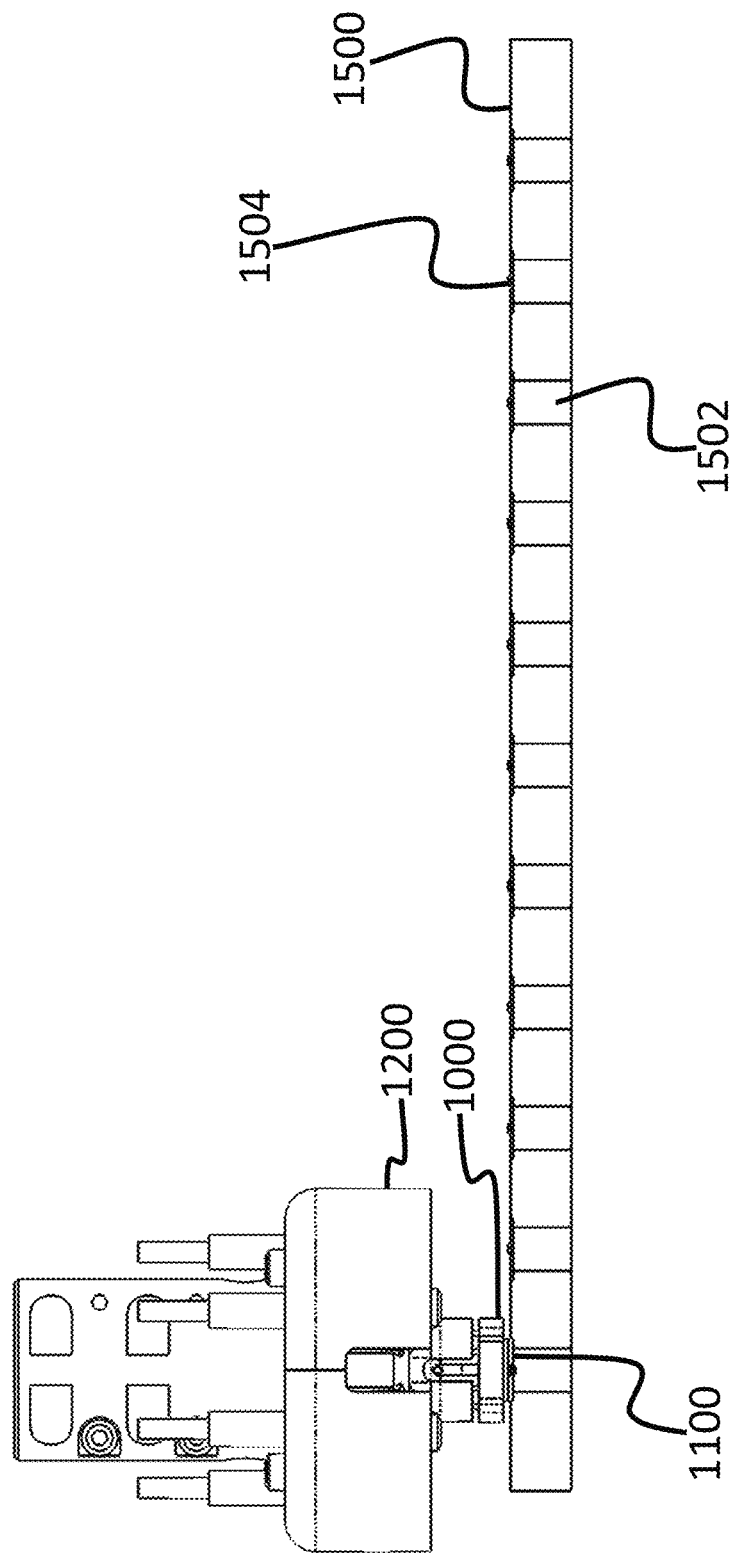
FIG. 17 is a side elevation view showing a die bond head positioned just above a machine deck having a plurality of pockets configured to retain tips or end effectors in a nominal XYZT location, some pocket containing a tip or end effector, the die bond head depicted picking up a tip or end effector from a pocket of the machine deck, in accordance with embodiments of the present disclosure.

Now referring to FIGS. 15-17, a machine deck 1500 having a plurality of pockets 1502 configured to retain tips 1100 in a nominal XYZT location is shown.

In embodiments, the machine deck 1500 having a plurality of pockets 1502 configured to retain tips 1100 in a nominal XYZT location is shown accompanied by a die bond head 1200 in the process of picking up a tip 1100. In embodiments, machine vision techniques are used to align the die bond head 1200 and tip 1100 to ensure sufficient accuracy. In embodiments, the combination of an up-look and down-look camera is used to align the die bond head 1200 and tip 1100. In embodiments utilizing up-look and down-look cameras, the cameras may be configured to have a relatively shallow depth of field and achieve depth control through focus.

Such a camera system may be referred to as a near field optics assembly 600 and may also be used to ensure minimal placement error when configured such that one camera looks up towards a die to be bonded when positioned over a gantry work area and a second camera is positioned to look down towards a substrate (e.g. a wafer) in the vicinity of a die bonding location, as in various embodiments of the present disclosure. As the near-field optics system 600 is much the same, regardless of whether its concepts are applied to die bond head 1200/tip 1100 alignment or to die to substrate alignment, the system, as discussed below, should be understood to be useful in either context, even where it is described specifically in only one or the other.

More specifically, a near field optics assembly 600, in embodiments, comprises a pair of cameras, optics, and sources of illumination. One camera is configured to look up at die fiducials (or the die bond head 1200) while the other looks down on corresponding substrate fiducials near which the die is to be placed (or on tips 1100 to be secured to the die bond head 1200). A die is picked and presented at a nominal XYTheta place location, but with a sufficient 'Z' separation to introduce the near field optics assembly 600.

In embodiments, the near field optics assembly 600 is mounted on a high precision, suspended XY gantry device. With the die and substrate stationary, the near field optics assembly 600 is introduced between the two and images a pair (or more) of die fiducials and corresponding substrate fiducials. The error between ideal die and substrate alignment is then calculated before retracting the near field optics assembly 600. The gantry is then commanded to make the delta motion in XYT before moving in Z to place a die at its final location.

Importantly, the near field optics assembly 600 calibration needs to be stable for the machine performance to be stable. The near field optics assembly 600 is susceptible to thermal drifts if the environment changes or if heat is introduced by the process, or machine elements (e.g. heating elements). Putting the entire machine in a thermally stable environment may not accomplish this goal, since there is no good way of controlling the machine elements without limiting the machine utility and/or cycle time, since they are actively used in the process the machine runs. For these reasons, it has been found that it is better to thermally control the precision alignment apparatus (i.e. near field alignment optics assembly 600) than the entire machine or put limits on the machine elements. With a stable near field optics assembly 600, especially one that is relatively small in mass and size relative to the entire machine, the machine calibration becomes less critical.

To keep the near field optics assembly 600 at a stable temperature, air cooling alone will not suffice, since air temperatures inside and outside the machine will inevitably vary, at least in part due to normal factory operating conditions. A more efficient way of achieving temperature stability is to water cool the near field optics assembly 600. In embodiments, this is accomplished using an external chiller, which cools water in a reservoir to a stable temperature. The water is then pumped into the near field optics assembly 600, which comprises machined channels for the water to flow through. The 'warmer' water is circulated back into the reservoir where it mixes with the cooler water.

In embodiments, the chiller operates continuously when the machine is turned off, idle or running, keeping the near field optics assembly 600 at a stable temperature setting at all times. If calibrated following temperature stabilization, as is done in embodiments, the machine stays in specification regardless of the process that the user runs on the machine or changes in ambient conditions.

Now referring to FIG. 16, a view of the machine deck 1500 of FIG. 15 having a plurality of pockets 1502 configured to retain tips 1100 in a nominal XYZT location, the pockets 1502 each containing a tip 1100, is shown with a die heater 1000 connected to a die bond head 1200 picking up a tip 1100 for use.

In embodiments, the outer vacuum ports 1002 of the die heater 1000 are used to secure a tip 1100 to the die heater 1000 using vacuum port 1006 and to secure a die to the tip 1100 using central vacuum ports 1010/1102, allowing for the controlled pick and release of a component or die. In embodiments, the central port 1102 also acts as a locating pin, allowing the tip 1100 to expand without effecting die or component placement accuracy. In embodiments, the central vacuum port 1102 of the tip 1100 is chamfered to allow for at least partial self-locating between tip 1100 and die.

In embodiments, the die heater 1000 is made with Aluminum Nitride (AlN) or similar ceramic material for fast thermal response and high thermal stability.

In embodiments, the die heater 1000 and tip 1100 are capable of being heated to high temperatures, in embodiments ~450° C.

In embodiments, non-heated tips 1100 are used. In embodiments, non-heated dies having an extension for positioning dies within narrow cavities are used in conjunction with the die heater 1000. In embodiments, non-heated tips are made of Stainless Steel (SS) while, in other embodiments, non-heated tips are made of Tungsten Carbide (WC).

In embodiments, outer vacuum ports 1002 of the die heater 1000 are used to provide vacuum to secure tips 1100 through vacuum port 1006 while the centrally-located vacuum port 1010 is used to provide vacuum to secure a die or other component to the tip 1100 is designed to place thereto. In embodiments, the tip 1100 comprises a cavity connecting the central vacuum port 1102 used to secure a die or other component to a region of the tip 1100 configured to interface with the die or component (e.g. central vacuum port 1102) through central vacuum port 1102.

In embodiments, coolant is introduced into heaters to rapidly cool them and any attached tip 1100, speeding cycle times. In embodiments, multiple cooling ports are used. In embodiments, gaseous, liquid, solid, and phase change cooling mediums are utilized as coolant. In embodiments, air or nitrogen is used as a coolant, dependent on the specific application. Coolant may also be injected into a ceramic matrix, thereby containing the coolant, or simply allowed to disperse after being introduced to the die heater 1000.

In embodiments, a thermocouple, which may be a type K thermocouple, is used to measure the temperature of the die heater 1000. In embodiments, wires contained within the heater power leads 1004 are coated in Polytetrafluoroethylene (PTFE).

In embodiments, the tip 1100 is made of MN to provide fast thermal response. In another embodiment, the tip 1100 is made of Copper Tungsten (CuW), which provides heat-resistance, ablation-resistance, high thermal and electrical conductivity, and is easy to machine. In still another embodiment, the tip 1100 is made of Tungsten Carbide (WC).

In embodiments, the central aperture of the tip 1100 is configured to connect a vacuum port 1006 of the die heater 1000, which allows for releasably and controllably securing a die or component to the tip 1100, to the portion of the tip 1100 on which a die is configured to be held. In embodiments, the die-holding portion of the tip 1100 is a pedestal 1102 while, in other embodiments, it is a flat portion adjacent a conical portion of the tip 1100. The precise shapes, thicknesses, and configurations vary, in embodiments, to accommodate the dimensions of a substrate on which a die or component is to be placed.

In embodiments, a non-heated tip 1100 comprises a neck portion and a conical shaped tip 1100 is shown. The flat portion of the region adjacent the conical region, in embodiments, contains an aperture connecting the vacuum port 1006 of the die heater 1000 thereto, allowing for the controlled picking and releasing of a die or component. The neck portion of this embodiment allows the die to be placed within a cavity in the substrate.

In embodiments, the die heater comprises heater power and thermocouple leads, cooling air exhaust, cooling air inlet, and ceramic insulator with channels for air cooling.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

What is claimed is:

1. A die heating apparatus, the die heating apparatus comprising:
   a die heater configured to heat; and
   a plurality of rods fixed to said die heater, said rods being configured to allow said die heater to be retained,
   wherein said plurality of rods are evenly and concentrically disposed about a central axis of the die heater, and
   wherein said rods are configured to supply power and ground to the die heater.

2. The die heating apparatus of claim 1 wherein said plurality of rods serve as a flexure mount.

3. The die heating apparatus of claim 2 wherein said rods are configured to be retained by set screws.

4. The die heating apparatus of claim 1 further comprising a trough in communication with a vacuum source, the trough being surrounding a projection of substantially the same height as a remainder of a face of the die heater.

5. The die heating apparatus of claim 4 wherein said projection is circular and centrally disposed on said die heater.

6. The die heating apparatus of claim 1 wherein said die heater is configured to retain removable tips that are configured for picking and placing of a specific die or dies.

7. The die heating apparatus of claim 6 wherein said die heater is configured to gimbal.

8. A die bonding system, the system comprising:
   the die heating apparatus of claim 1;
   the die heating apparatus further comprising a central projection surrounded by a trough a first vacuum port disposed within the trough and configured to retain a tip and a second vacuum port disposed substantially centrally on said central projection, the second vacuum port being configured to provide vacuum to the tip; and a plurality of pockets configured to retain die-specific tips for use by the die heating apparatus, the die heating apparatus being further configured to pick and return tips to pockets, wherein the tip is configured to interface with a die or dies to be picked and placed and retain them by vacuum.

9. The die bonding system of claim 8 wherein said tip further comprises at least one fiducial.

10. The die bonding system of claim 8 wherein said tip further comprises at least two fiducials.

11. The die bonding system of claim 10 wherein the tip further comprises at least one alignment feature configured to provide for rough alignment between the tip and die heating apparatus.

12. The die bonding system of claim 11 wherein at least one of the plurality of pockets further comprises a dowel configured to interface with and restrict the motion of a tip retained thereby.

13. The die bonding system of claim 12 further comprising at least one camera assembly configured to assist in calibration of alignment of said die heating apparatus and tip during picking of a tip from one of said plurality of pockets.

14. A die bonding system, the system comprising:
a die heater comprising a central projection surrounded by a trough, the die heater further comprising a first vacuum port disposed within the trough and configured to retain a tip and a second vacuum port disposed substantially centrally on said central projection, the second vacuum port being configured to provide vacuum to the tip;
a plurality of pockets configured to retain die-specific tips for use by the die heater, the die heater being further configured to pick and return tips to pockets; and
a plurality of rods fixed to said die heater, said rods being configured to allow said die heater to be retained,
wherein said plurality of rods are evenly and concentrically disposed about a central axis of the die heater,
wherein the tip is configured to interface with a die or dies to be picked and placed and retain them by vacuum; and
wherein said plurality of rods are configured to supply power and ground to the die heater.

15. The die bonding system of claim 14 wherein said tip further comprises at least one fiducial.

16. The die bonding system of claim 14 wherein at least one of the plurality of pockets further comprises a dowel configured to interface with and restrict the motion of a tip retained thereby.

* * * * *